TUNER

Filed Oct. 2, 1952

3 Sheets-Sheet 1

INVENTORS.
Rudolf Wm. Selbmann
and Goro R. Tahara
Robert S. Mautner.
By: Robert L. Kahn Atty.

INVENTORS.
Rudolf Wm. Selbmann
and Goro R. Tahara
Robert S. Mautner.
By. Robert L. Kahn Atty.

Sept. 11, 1956 R. W. SELBMANN ET AL 2,762,925

TUNER

Filed Oct. 2, 1952 3 Sheets-Sheet 3

INVENTORS
Rudolf Wm. Selbmann
and Goro R. Tahara
Robert S. Mautner.
By. Robert L Kahn Atty.

2,762,925

TUNER

Rudolf W. Selbmann, Jamaica, and Goro R. Tahara and Robert S. Mautner, Massapequa, N. Y., assignors to Oak Mfg. Co., a corporation of Illinois Application October 2, 1952, Serial No. 312,802
6 Claims. (Cl. 250—40)

This invention relates to a continuous type tuner for broad band coverage at high frequencies. While the tuner forming the subject matter of the present invention is adapted for general use in the megacycle range, it is particularly adapted for use in television and frequency modulation bands as presently assigned by the Federal Communications Commission.

It is well known that a continuous tuning range may be extended by simultaneous variation of inductance and capacitance, hereinafter referred to as L and C respectively. In prior art tuners, a substantial problem has been to reduce the minimum values of L and C in order to extend the tuning range. In all cases a maximum variation of L and C respectively is desirable. At the low end of the range, L and C maximum are concomitants. At the high end of the range, L and C minimum are concomitants. The nearer to zero a minimum can be reduced the more extended is the high end of the range.

In general, for the frequencies involved, obtaining maximum values of L and C, independently of other considerations, is not difficult. The difficulty arises in obtaining a satisfactory minimum value of L or C when suitable maximum values have been provided.

This invention provides a construction which is simple to manufacture, has high efficiency (Q) and has a greatly extended tuning range. Within the tunable range, continuous tuning is possible. The new construction makes tracking between various tuning sections readily possible and also makes it possible to obtain a satisfactory and usable characteristic of frequency versus tuning angle. Thus certain continuous tuners are inherently incapable of avoiding a concentration of tunable frequency range at some part of the angular range of the tuner.

In order that the invention may be understood, both in the broader and more specific aspects, it will be described in connection with the drawings wherein an exemplary embodiment is shown. As will be demonstrated later, various modifications may be made without departure from the more fundamental aspects of the invention, some of these modifications being suggested here and others occurring to those skilled in this art.

Figure 1:
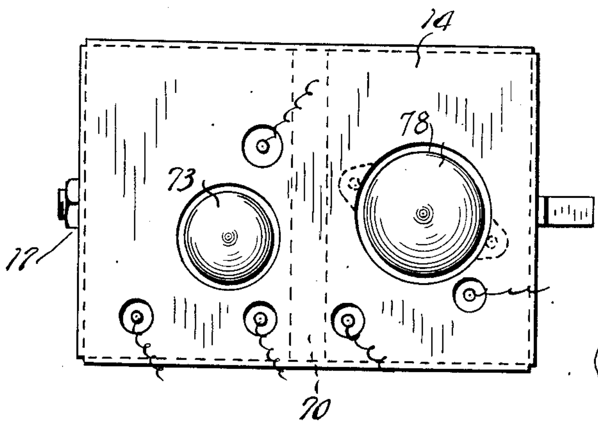
Figure 1 is a top plan view of a tuner embodying the present invention.

The tuner has a metal frame of suitable material as steel and of a sufficiently heavy gauge to maintain the various tuner elements in predetermined relation. The frame includes bottom wall 10, sides 11, 12 and 13 and top 14. A removable cover plate, not shown, is adapted to be bolted to the frame, the removable plate being opposite side 13.

Frame wall 11 is provided with adjustable thrust bolt 17. Wall 12 is slotted at 18. Between thrust bolt 17 and the bottom of slotted part 18 there is rotatively supported insulating shaft 20 having conical-shaped metal bearing sleeve 21. As is evident from the construction, shaft 20 may be slipped into position in the frame. The shaft is preferably of a material having a high insulating value and low loss characteristics for high frequencies and having desirable mechanical properties.

Figures 9, 10:
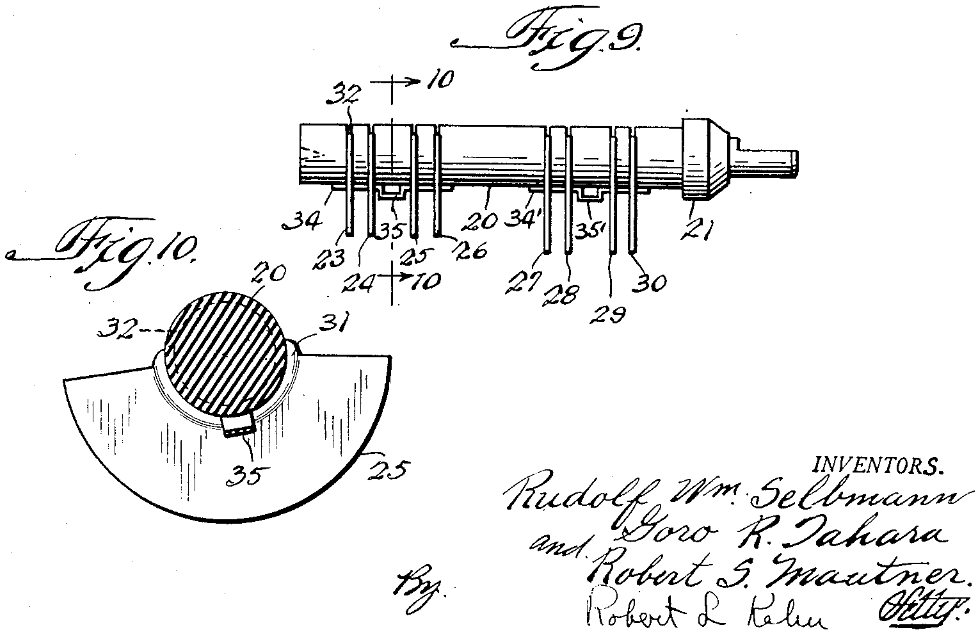
Figure 9 is a detail of the rotor.
Figure 10 is a section on line 10—10 of Figure 9.

Shaft 20 carries a number of rotor plates which resemble condenser rotor plates both in construction and general shape. The tuner illustrated has two sections, one for band tuning high-frequency energy from an antenna and the other for tuning an oscillator. Such a tuner is used in receivers of the superheterodyne type. As shown in Figure 9, shaft 20 carries rotor plates 23 to 30 inclusive. Plates 23 to 26 inclusive are used for one tuner section while plates 27 to 30 inclusive are used for another tuner section. The plates may have generally similar shapes as shown in Figure 10. The angular extent of the active parts of the rotor plates is preferably somewhat less than 180° and may, for example, be about 170°. Each plate has a generally semi-circular mounting portion 31 which is wedged or otherwise tightly retained in annular slots 32 in the shaft. This manner of securing the rotor plates is well known in the tuner art.

Plates 23 and 24 function as one unit, normally being disposed on opposite sides of the capacitor portion of a stator electrode. The same is true for the remaining pairs of rotor plates 25 and 26; 27 and 28; and 29 and 30. All the rotor plates for a tuning section are preferably connected together by suitable means as a metal strap 34. This strap is of copper or silver plated copper or other suitable material and extends through apertures in the rotor plates along the surface of shaft 20. The rotor plates are soldered to the strap to insure excellent contact. The rotor plate units may be connected by a metal sleeve over that part of the shaft. This is generally undesirable as it reduces the tuning range. The rotor plates of a tuning section have strap portion 35 connecting them and this portion may be treated differently than as a simple metallic connecting link. As shown, strap portion 35 extends outwardly from shaft 20 and in effect forms an inductance. If desired, portion 35 might be omitted and two tiny condenser plates substituted therefor. In such case, rotor plates 23 and 24 as one unit would be capacitively coupled to plates 25 and 26 as the other unit. As shown, the coupling is inductive.

The other tuning section rotor plates 27 to 30 inclusive may be similarly handled. It is not necessary that the straps in one tuning section embody the same type of coupling element as the straps in another tuning section. Thus strap portion 35 may have predominantly inductive reactance while strap portion 35′ may have predominantly capacitive reactance. Strap 34 and strap 34′ for the two tuning sections may be connected together by a link and this link may have inductive or capacitive reactance as desired. As a rule, separate circuits are preferably isolated in the tuner as much as possible. The angular position of strap 34 and 34′ may be as desired but preferably the strap is disposed symmetrically with respect to the ends of the almost semi-circular rotor plates.

Figure 7:
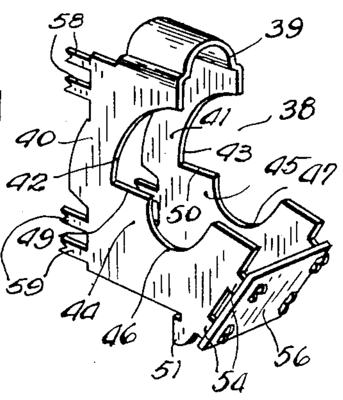
Figures 7 and 8 are perspectives of the stator parts of the tuner for a circuit and oscillator section respectively.
Figure 2:
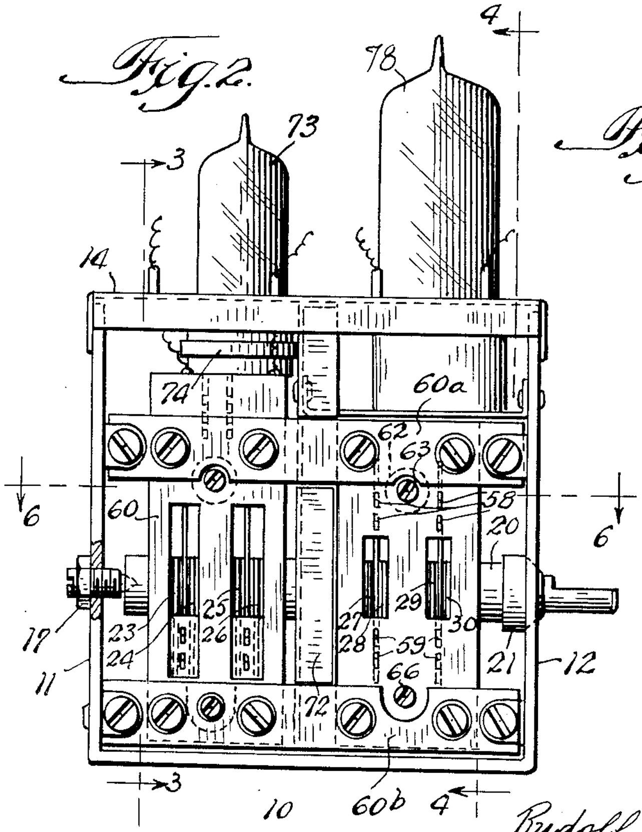
Figure 2 is a side view, with certain parts broken away, of the tuner of Figure 1.
Figure 8:
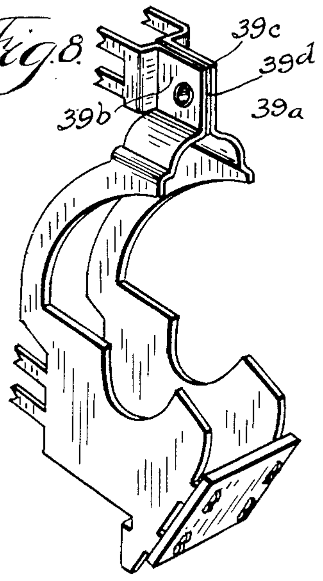

Each tuning section has a stator unit. The stator unit for an oscillator section is shown in Figure 8 whereas the stator unit for a simple tunable circuit is shown in Figure 7. In general the two stator units are similar except that the oscillator unit is divided into two portions capacitively coupled to each other because of the connections to the grid and anode of an oscillator tube.

Figure 5:
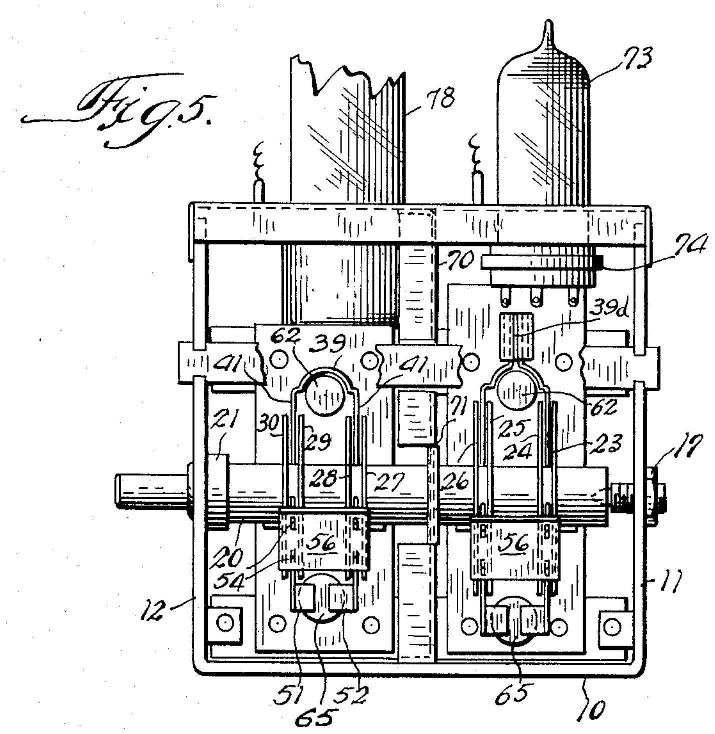
Figure 5 is a side view similar to Figure 2 but showing the other side.
Figure 6:
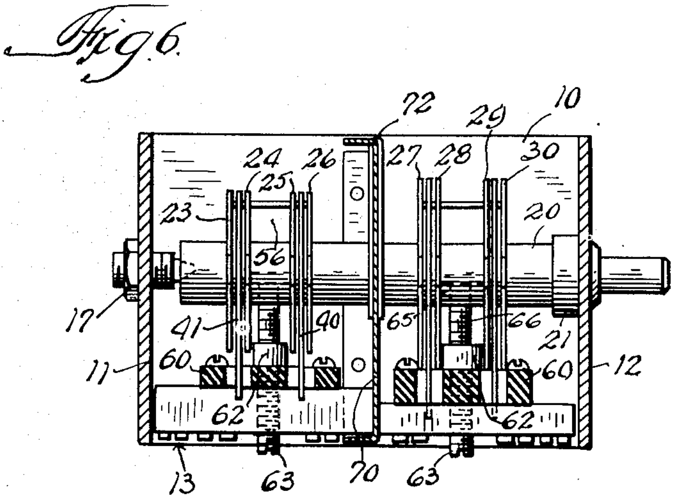
Figure 6 is a section on line 6—6 of Figure 2.

Referring first to Figure 7, the stator unit, generally indicated by numeral 38, has inductance loop portion 39 from which extend inductance arm portions 40 and 41. Inductance arm portions 40 and 41 have generally arcuate edge portions 42 and 43. Inductance arm portions 40 and 41 are extended into capacitor portions 44 and 45. These capacitor portions are cut out at 46 and 47 to clear shaft 20. Shoulders 49 and 50 divide the capacitor portions from the inductance arms. These shoulders may be designed to have any suitable shape and angle. Capacitor portions 44 and 45 have trimmer ears 51 and 52 (see Figure 5) extending therefrom. The stator unit is formed of copper or silver-plated copper and has mounting fingers formed for securing the stator unit. Fingers 54 form one group which cooperate with insulating plate 56 for steadying the opposed capacitor portions. Fingers 58 and 59 cooperate with insulating support plate 60 rigidly secured by insulating bars 60*a* and 60*b* to side 13 of the frame. It is understood that the inductance arms and capacitor portions of a stator unit are generally parallel to each other.

The stator unit for an oscillator section, shown in Figure 8, is generally similar to the unit so far described. Inductance loop portion 39 is divided at 39*a* into small capacitor plates 39*b* and 39*c* insulated from each other by sheet 39*d*. The mounting fingers may be used as electrical connectors to couple the grid and anode electrodes of a vacuum tube so that an oscillator is provided.

The stator units may have any desired angular extent (with reference to the shaft axis) for the capacitive and inductive portions. The capacitive portions may be considered as extending from shoulders 49 and 50 and, as shown here, have an angular extent of about 170°. The inductive portion consisting of arms 40 and 41 and loop 39 have an angular extent of about 90°. Thus the total stator angular extent, in the structure shown, will be about 260°.

It is possible to increase the angular extent of the inductive portion, decrease the angular extent of the capacitive portion or do both. The angular extent of the rotor will naturally be a factor.

It is preferred to have the radius of the rotor plates somewhat smaller than the radius of curved parts 42 and 43. Thus no overlap will occur between the rotor plates and inductance arms of the stator.

Figures 3, 4:
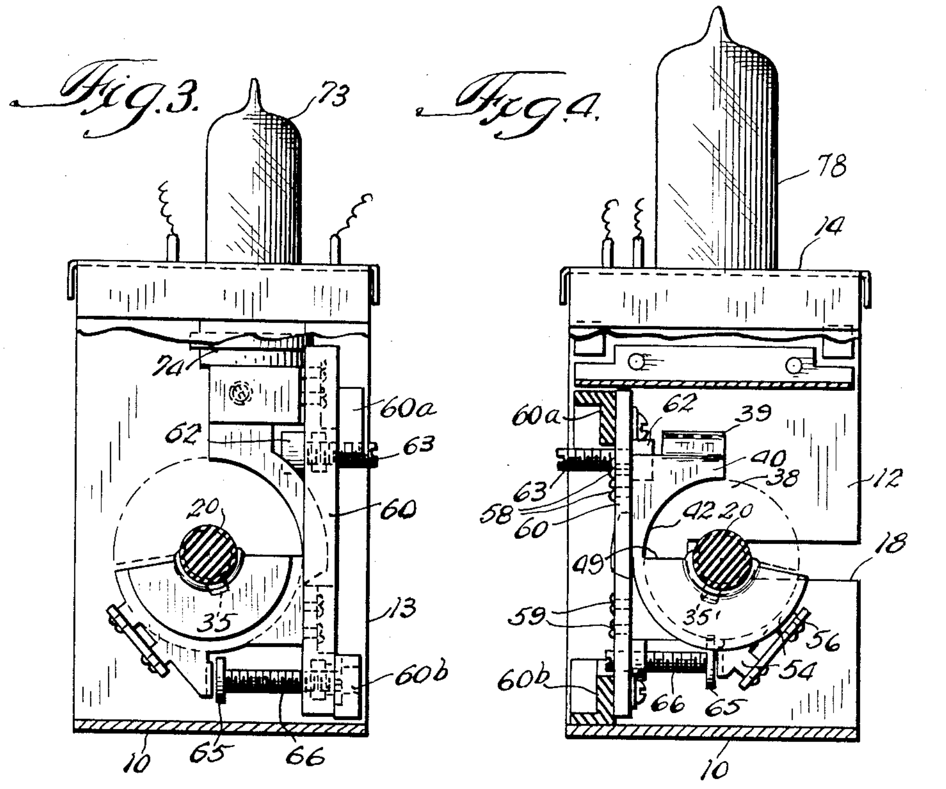
Figure 3 is a section on line 3—3 of Figure 2.
Figure 4 is a section on broken line 4—4 of Figure 3.

Before proceeding further with the construction of the tuner, an analysis of the operation of the rotor and stator elements will be given. With the rotor as shown in Figure 3, where the rotor does not mesh with the capacitor stator portions, each rotor plate acts as a secondary for the inductance portion of the stator. The inductance of the stator loop is reduced by the rotor plates. The straps between rotor plates do not function to introduce any reactance into the tuned circuit.

When the rotor plates mesh with the capacitive portions of the stator, the rotor plates function as plates of a condenser. Since the rotor plates are connected in series through the strap, inductive reactance is introduced into that part of the circuit between the capacitive portions of the stator. The inductance of the loop is also in series with the capacitive portions of the stator. This stator inductance is at maximum value.

The dimensions of the rotor plates for a tuning section and inductance loop connecting these plates are such that the resonant frequency of these elements forming a tank circuit by themselves is at least equal to and preferably higher than the highest frequency to be tuned. The rotor parts of a tuning section will provide a predominantly inductive reactance for frequencies below the resonant frequency. As the rotor plates mesh with the stator capacitor plate portions, more inductance from the rotor parts is coupled. This results in extending the low frequency end of the range.

It is preferred not to have the resonant frequency of the rotor plates and rotor loop too high above the highest tunable frequency since the effect of the rotor inductance loop is minimized. If the resonant frequency is too low, energy in the tunable range is absorbed and in the oscillator section would result in suppressing oscillations. A desirable resonant frequency for a tuning section rotor plate and loop is between the highest frequency to be tuned and two times this frequency. An oscillator will have different rotor plates and loop resonant frequency than a band pass tuning section.

The position where the rotor plates mesh with the stator capacitor plates is the low frequency position for the tuner. The position where the rotor plates are free of the capacitive portions of the stator, as in Figure 3, is the high frequency position of the tuner. In this position, capacitance and inductance are both at minimum values.

It is clear that the inductance of the loop and loop arms will be varied with rotor movement. The same is true of the capacitive portions of the stator. The inductance between the two rotor units due to the loop in strap 34 probably remains substantially constant. However, this rotor inductance may have a variable effect on the tunable circuit due to the variation in coupling of the rotor inductance and stator.

The stator unit for the oscillator, shown in Figure 8, has the same general construction as regards inductance arms and capacitor portions. In the loop, the capacitive coupling due to parts 39*b* and 39*c* and the capacitance due to the vacuum tube oscillator are designed for the oscillating circuit. The contour and area of the oscillator stator element may differ from the contour and area of the band pass stator in Figure 7 so that proper tracking will occur over the tuning range. In general, if additional circuits are added, the rotors and stators of such additional sections will be similar to the stator of Figure 7 and its cooperating rotor.

The rotor plates may be radially slotted at suitable angular intervals to permit individual adjustment at various rotor positions. This expedient is well known in the variable condenser art for radio receivers and need not be explained in detail.

Trimmers are provided for the inductance loop of each stator and also for each capacitor portion. Referring to Figures 3 to 6 inclusive, the inductance loop portion of each stator has cooperating therewith slug 62 of brass or other suitable material. Slug 62 is carried by bolt 63 supported in insulating panel 60. By turning bolt 63 in the panel, slug 62 is moved to or from the stator and may be adjusted relative to loop 39 of a stator. As is shown in Figures 7 and 8, the loop portions have rounded shapes. Slugs 62 are generally cylindrical and when extended into the loop region will generally be more or less symmetrically disposed with respect to the loop material. Due to the insulating mounting of the slug, the entire trimming action is on the inductance with little or no effect on the capacitance.

Cooperating with capacitor trimmer ears 51 and 52 of a stator is trimmer plate 65 carried by bolt 66 supported in panel 60. Trimmer plate 65 cooperates with both trimmer ears 51 and 52 and provides a balancing capacitance in series with capacitor portions 44 and 45 of a stator. The capacitor trimmer has little or no effect on inductance due to the location of the trimmer ears.

The frame is provided with metal dividing shield 70 to separate the frame compartments for the tuner sections. This dividing shield is slotted at 71 to accommodate shaft 20 when positioned in the frame. Slot 71 is covered by metal spring shield clip 72 at those parts above the shaft. The entire frame and shield walls and clip are well connected together to provide a low resistance surface for the tuner. It is understood that a metal cover plate is provided opposite side 13 and this plate is well connected to the frame. The frame, stator and rotor are so designed that the stator and rotor parts are generally symmetrically disposed within the respective frame compartments. Since none of the tank circuits, consisting of the tuner sections, are connected to the frame, no tank currents flow in the frame. Hence the frame may function as an equipotential surface.

A vacuum tube suitable for oscillation at the desired frequency range is provided in close proximity to the oscillator tuning section. Tube 73 fits on the tube socket 74, carried by sub-base 75. Connections from the control grid and anode of the oscillator tube are made to stator portion 39*b* and 39*c*.

A high-frequency amplifier 78 is supported on a tube socket carried on a sub-base above the band tuner elements. The lead ins and the pick-up loops or plates for coupling each tuning section to another tuning section or to load circuits are conventional.

A stator element may have one or both arms terminate in several spaced condenser plate portions. Instead of one capacitor plate 44, two such plates offset to be parallel, like a conventional condenser, may be provided. Preferably the two arms of a stator element are symmetrical. Additional rotor plates would be provided.

What is claimed is:

1. A tuner variable over a continuous range comprising a flat metal stator bent out of its plane to a U shape, said stator being shaped so that a side elevation of the stator shows a general C shape, the bight of the U being at the top and the ends of the U flaring in width to form stator capacitor plates, an insulated shaft having its axis perpendicular to the planes of the capacitor plates, said insulated shaft having at least one metal plate for each stator plate, the metal plates carried by said insulated shaft constituting rotor plates and being shaped and located so that from a side elevation of the stator said rotor plates in one position may mesh with the stator plates and in another position may be free of the stator plates but can lie within the curve of the upper portion of the C shape of the stator, said rotors being free of any metallic connections with any stator parts.

2. The structure according to claim 1 wherein a metallic connection is provided between all the rotor plates.

3. The structure according to claim 1 wherein a metallic connection is provided between all the rotor plates, said metallic connection including a part having substantial inductance at the frequencies involved, said part being between the rotor plates cooperating with opposite ends of the stator element.

4. The structure according to claim 1 wherein a stator element has one condenser plate at each free end of the arms and two rotor plates cooperating with opposite sides of each condenser plate.

5. The structure according to claim 1 wherein each stator element has one condenser plate at the end of each arm, two rotor plates cooperating with the opposite sides of each condenser plate, a metal strip disposed along the shaft connecting the four rotor plates for a tuning section and a loop formed in said strip to provide inductance, said loop being disposed in that part of the strip which connects the inner two rotor plates, said rotor plates and loop having a resonant frequency which is at least as high as the highest frequency to be tuned, said last-named loop forming a coupling between the rotor plates and the loop itself and being substantially free of any coupling with any stator elements.

6. The structure according to claim 1 wherein the ends of the arms of a stator element have trimmer ears and wherein a trimmer plate is provided cooperating with the two trimmer ears and wherein means are provided for adjusting said trimmer plate.

References Cited in the file of this patent

UNITED STATES PATENTS

| | | |
|---|---|---|
| 2,367,681 | Karplus et al. | Jan. 23 1945 |
| 2,385,131 | Garthwaite | Sept. 18, 1945 |
| 2,422,454 | Weiss | June 17, 1947 |
| 2,521,963 | Beusman | Sept. 12, 1950 |
| 2,540,137 | Page | Feb. 6, 1951 |
| 2,593,361 | Sziklai | Apr. 15, 1952 |